(12) United States Patent
Hattori

(10) Patent No.: US 6,600,660 B2
(45) Date of Patent: *Jul. 29, 2003

(54) PLUG-IN UNIT STORAGE RACK-TYPE APPARATUS

(75) Inventor: Takeshi Hattori, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/525,916

(22) Filed: Mar. 15, 2000

(65) Prior Publication Data

US 2002/0135990 A1 Sep. 26, 2002

(30) Foreign Application Priority Data

Mar. 24, 1999 (JP) ............................................ 11-080499

(51) Int. Cl.⁷ .............................. H05K 7/10; H05K 9/00
(52) U.S. Cl. ...................... 361/801; 361/730; 361/796; 361/816; 174/33 R; 174/35 GC
(58) Field of Search ................................. 361/685, 728, 361/729–731, 732, 736, 740, 741, 747, 752, 753, 756, 757, 759, 799, 800, 801, 802, 816, 818, 796, 797; 174/35 R, 35 GC, 51

(56) References Cited

U.S. PATENT DOCUMENTS

| 5,522,602 | A | * | 6/1996 | Kaplo et al. ............ 174/35 GC |
| 5,746,326 | A | * | 5/1998 | Hong .......................... 361/800 |
| 5,782,546 | A | | 7/1998 | Iwatare |
| 5,999,403 | A | | 12/1999 | Neustadt |

FOREIGN PATENT DOCUMENTS

| JP | 61-46797 | 3/1986 |
| JP | 61-65797 | 5/1986 |
| JP | 1-124629 | 8/1989 |
| JP | 4-90186 | 3/1992 |
| JP | 4-28496 | 6/1992 |
| JP | 4-70791 | 6/1992 |
| JP | 4-70797 | 6/1992 |
| JP | 4-90186 | 8/1992 |
| JP | 6-252575 | 9/1994 |
| JP | 7-50495 | 2/1995 |
| JP | 8-199935 | 8/1996 |
| JP | 9-223887 | 8/1997 |
| JP | 9-283965 | 10/1997 |
| JP | 10-322059 | 12/1998 |

* cited by examiner

Primary Examiner—Jayprakash N. Gandhi
(74) Attorney, Agent, or Firm—Foley & Lardner

(57) ABSTRACT

A plug-in unit storage rack-type apparatus includes a plurality of plug-in units, and a subrack. The subrack stores, from a front side, the plurality of plug-in units at a pitch including a clearance for preventing interference to an adjacent unit. The plug-in unit has microbristles for closing the clearance to the adjacent unit when stored in the subrack.

6 Claims, 9 Drawing Sheets

PLUG-IN UNIT STORAGE RACK-TYPE APPARATUS

BACKGROUND OF THE INVENTION

The present invention relates to a plug-in unit storage rack-type apparatus and, more particularly, to a plug-in unit storage rack-type apparatus which dissipates heat of plug-in units stored in a rack-type case by air supply and exhaust by a fan.

In a conventional plug-in unit storage rack-type apparatus shown in FIG. 7, subracks 202 each storing plug-in units 203 from the front side, as shown in FIG. 8A, are inserted and fixed in a rack 201 as a case. This rack-type apparatus has a heat dissipation structure comprising fans 205, air intake portion 204, and exhaust portion 206.

In this heat dissipation structure, the fans 205 draw air from the lower portion and blow it upward to forcibly cool the plug-in units 203. Air supply and exhaust are done by the air intake portion 204 provided at the lower portion of the rack-type apparatus and the exhaust portion 206 provided at the upper portion of the rack-type apparatus, so an air path as shown in FIG. 9 is formed.

If dust enters the rack 201 together with air, the dust sticks to the solder portion of a VLSI chip mounted in the plug-in unit 203. The dust may absorb moisture and short-circuit the circuit. The conventional plug-in unit storage rack-type apparatus has a filter 207 at the air intake portion 204, thereby preventing the fans 205 from drawing dust.

In the conventional rack-type apparatus, the plug-in units 203 are inserted/removed through the front side of the subrack 202. To prevent interference between adjacent units, clearances as shown in FIG. 8B are ensured between the plug-in units 203. Dust enters from the clearances due to the suction force of the fans 205. In fact, a large amount of dust enters from the clearances on the front side of the plug-in units 203.

SUMMARY OF THE INVENTION

It is therefore a principal object of the present invention to provide a plug-in unit storage rack-type apparatus capable of preventing dust from entering from clearances between plug-in units.

In order to achieve the above object, according to the present invention, there is provided a plug-in unit storage rack-type apparatus comprising a plurality of plug-in units, a subrack for storing, from a front side, the plurality of plug-in units at a pitch including a clearance for preventing interference to an adjacent unit, wherein the plug-in unit has microbristles for closing the clearance to the adjacent unit when stored in the subrack.

DESCRIPTION OF THE PREFERRED EMBODIMENT

An embodiment of the present invention will be described below in detail with reference to the accompanying drawings.

Figure 1:
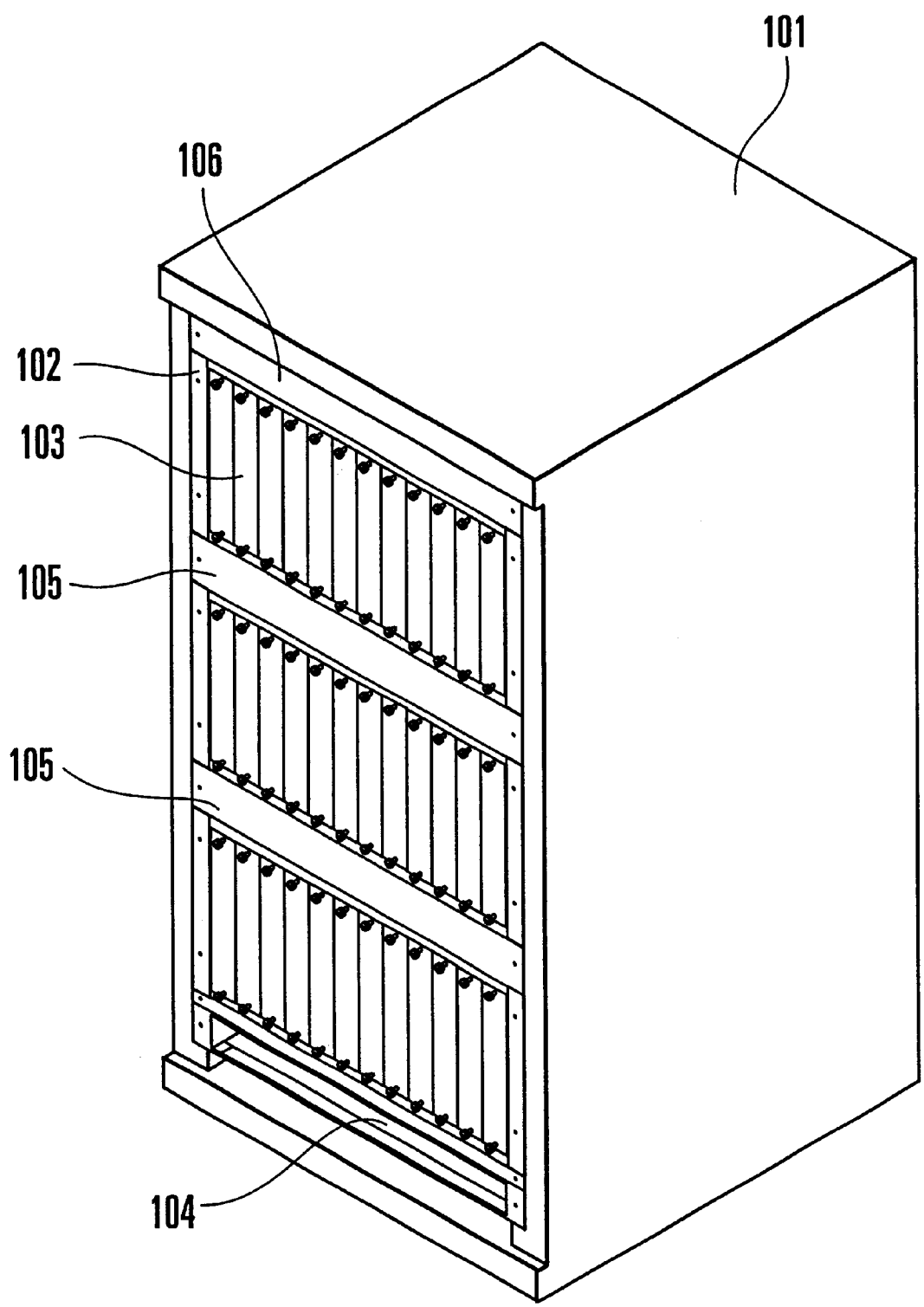
FIG. 1 is a perspective view showing the arrangement of a plug-in unit storage rack-type apparatus according to the present invention.

In a plug-in unit storage rack-type apparatus of this embodiment, subracks 102 are inserted and fixed in a rack 101 serving as a case, as shown in FIG. 1. Each subrack 102 stores plug-in units 103 from the front side at a pitch including a clearance for preventing interference to an adjacent unit. This rack-type apparatus has a heat dissipation structure comprising fans 105, air intake portion 104, and exhaust portion 106. The air intake portion 104 has a filter (not shown) that prevents dust from entering the apparatus.

Figure 2:
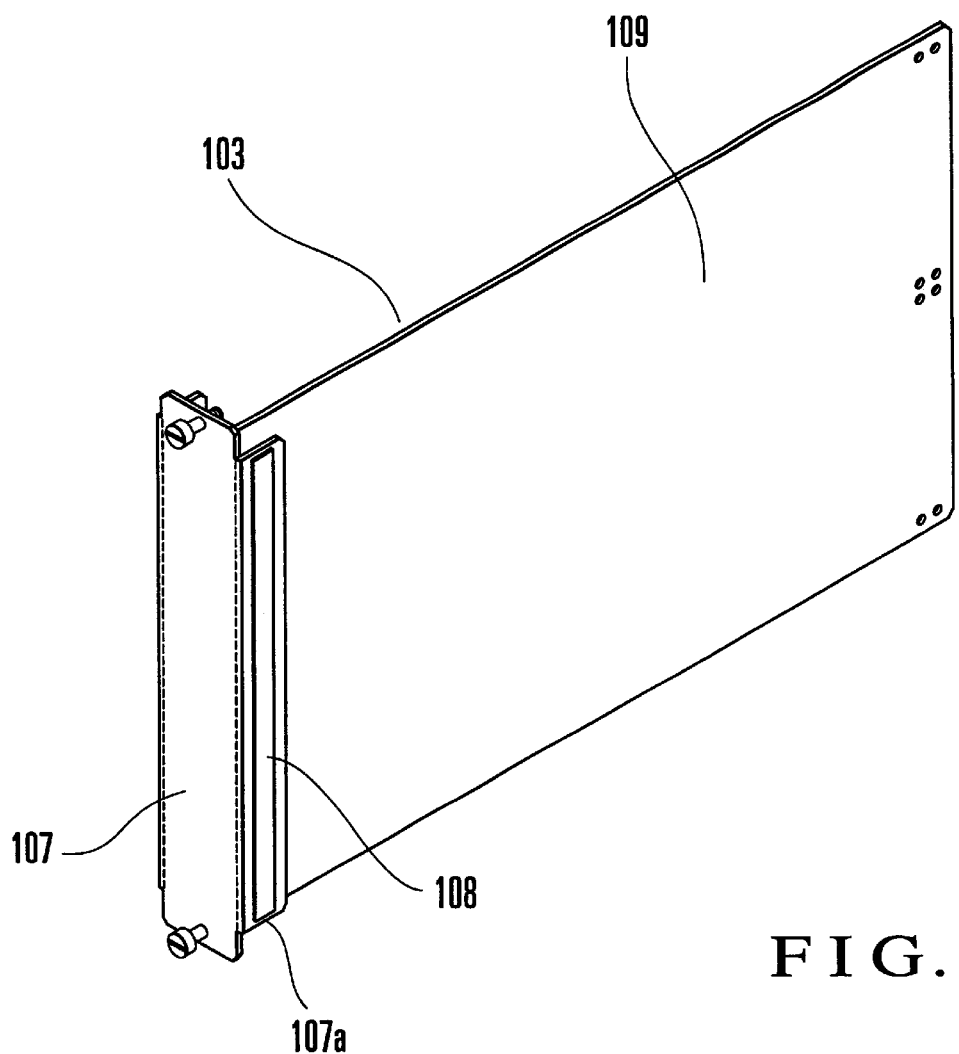
FIG. 2 is a perspective view of a plug-in unit according to an embodiment of the present invention.
Figure 3:
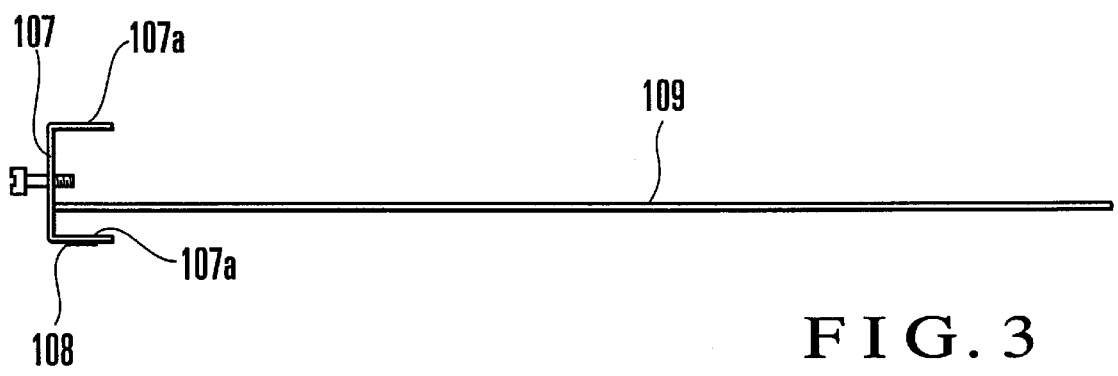
FIG. 3 is a plan view of the plug-in unit according to the embodiment of the present invention.
Figures 4A, 4B:
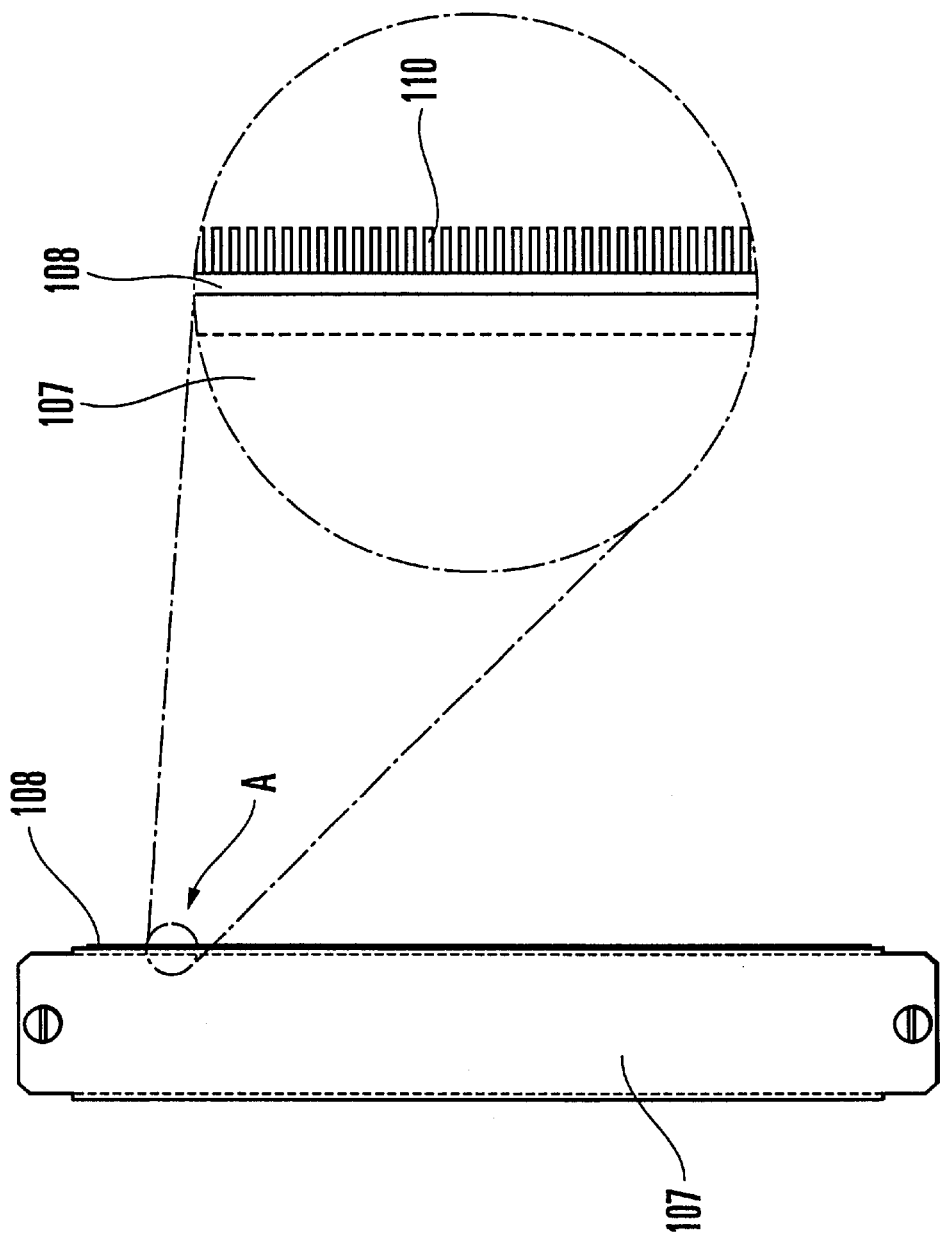
FIG. 4A is a front view of the plug-in unit according to the embodiment of the present invention.
FIG. 4B is an enlarged view of a portion A shown in FIG. 4A.

Each plug-in unit 103 stored in the rack-type apparatus has a front panel 107 and printed board 109, as shown in FIGS. 2, 3, and 4. The front panel 107 has a bent portion 107a. A dustproof sheet 108 having microbristles 110 is bonded to one side of the bent portion 107a. The microbristles 110 are elastic and are formed to a predetermined length larger than the clearance between adjacent units by a process such as filling. The interval between microbristles 110 is about 0.5 mm, though it is not particularly designated as far as they can prevent dust from entering the apparatus.

The operation of the plug-in unit storage rack-type apparatus of the present invention will be described next.

As described above, the subrack 102 of the rack-type apparatus of the present invention stores, from the front side, the plug-in units 103 at a pitch including a clearance for preventing interference to an adjacent unit.

To forcibly cool the plug-in units 103, the rack-type apparatus of the present invention has a heat dissipation structure comprising the fans 105, air intake portion 104, and exhaust portion 106. The heat dissipation structure of this rack-type apparatus is a so-called chimney structure in which air is drawn by the fans 105, blown upward, and exhausted from the exhaust portion 106.

The fans 105 draw external dust together with air. However, since the air intake portion 104 has a filter (not shown), dust is prevented from entering from the air intake portion 104.

Figure 5A:
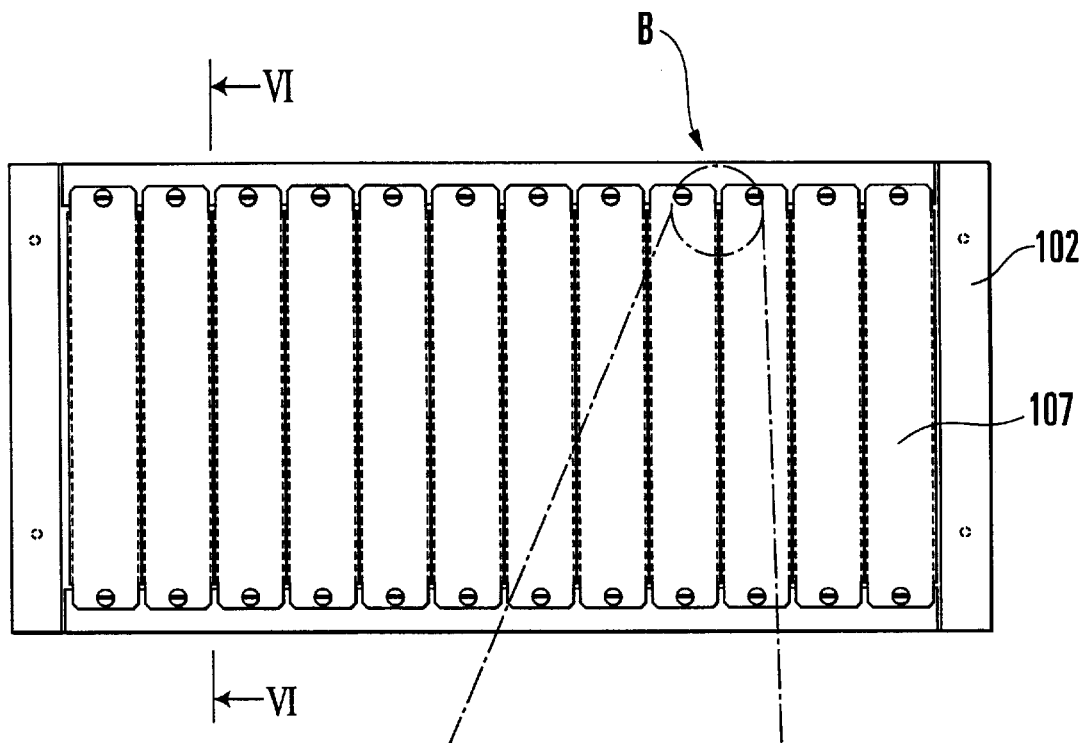
FIG. 5A is a front view of a subrack storing the plug-in unit according to the embodiment of the present invention.
Figure 5B:
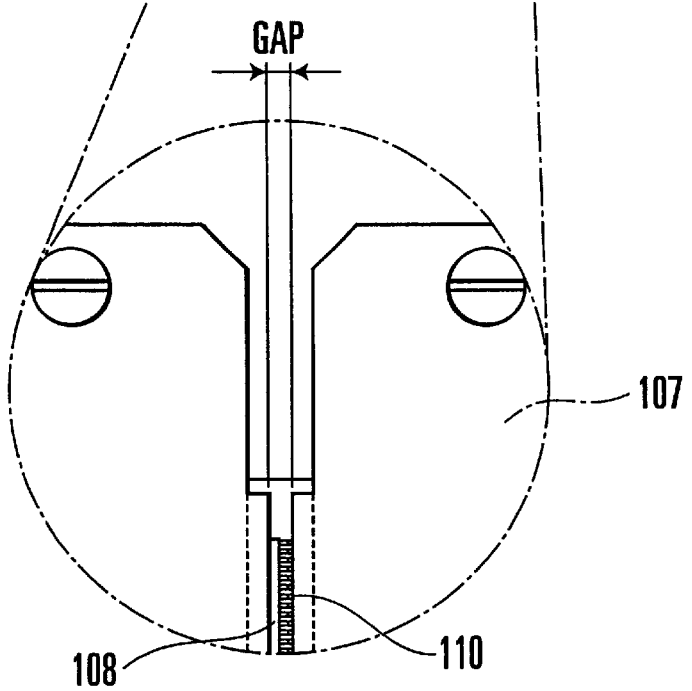
FIG. 5B is an enlarged view of a portion B shown in FIG. 5A.
Figure 6A:
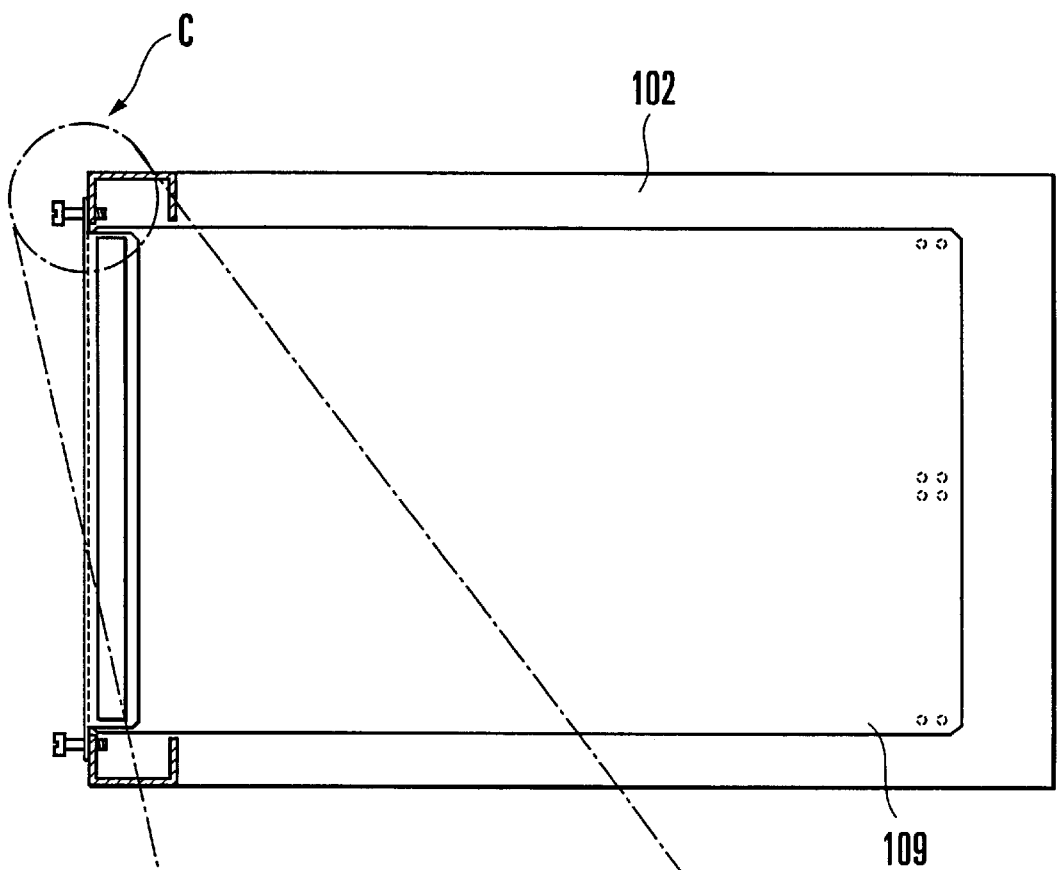
FIG. 6A is a sectional view taken along a line VI—VI in FIG. 5A.
Figure 6B:
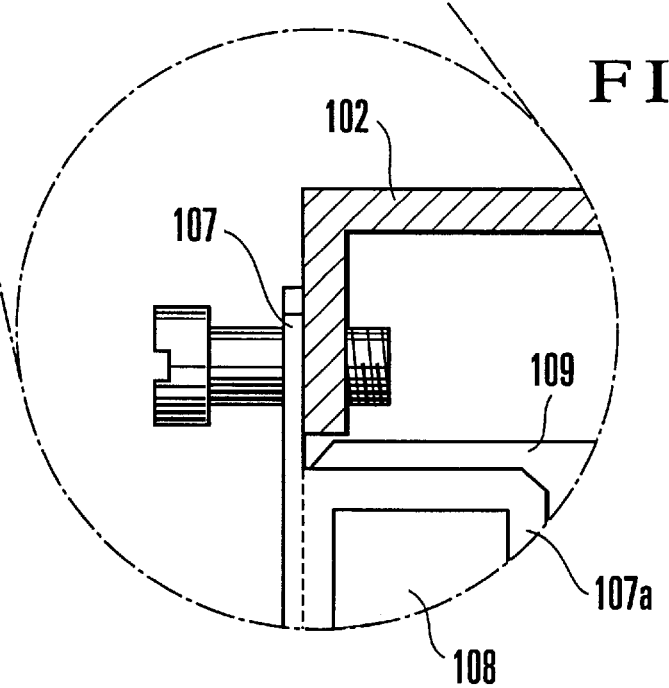
FIG. 6B is an enlarged view of a portion C shown in FIG. 6A.
Figure 7:
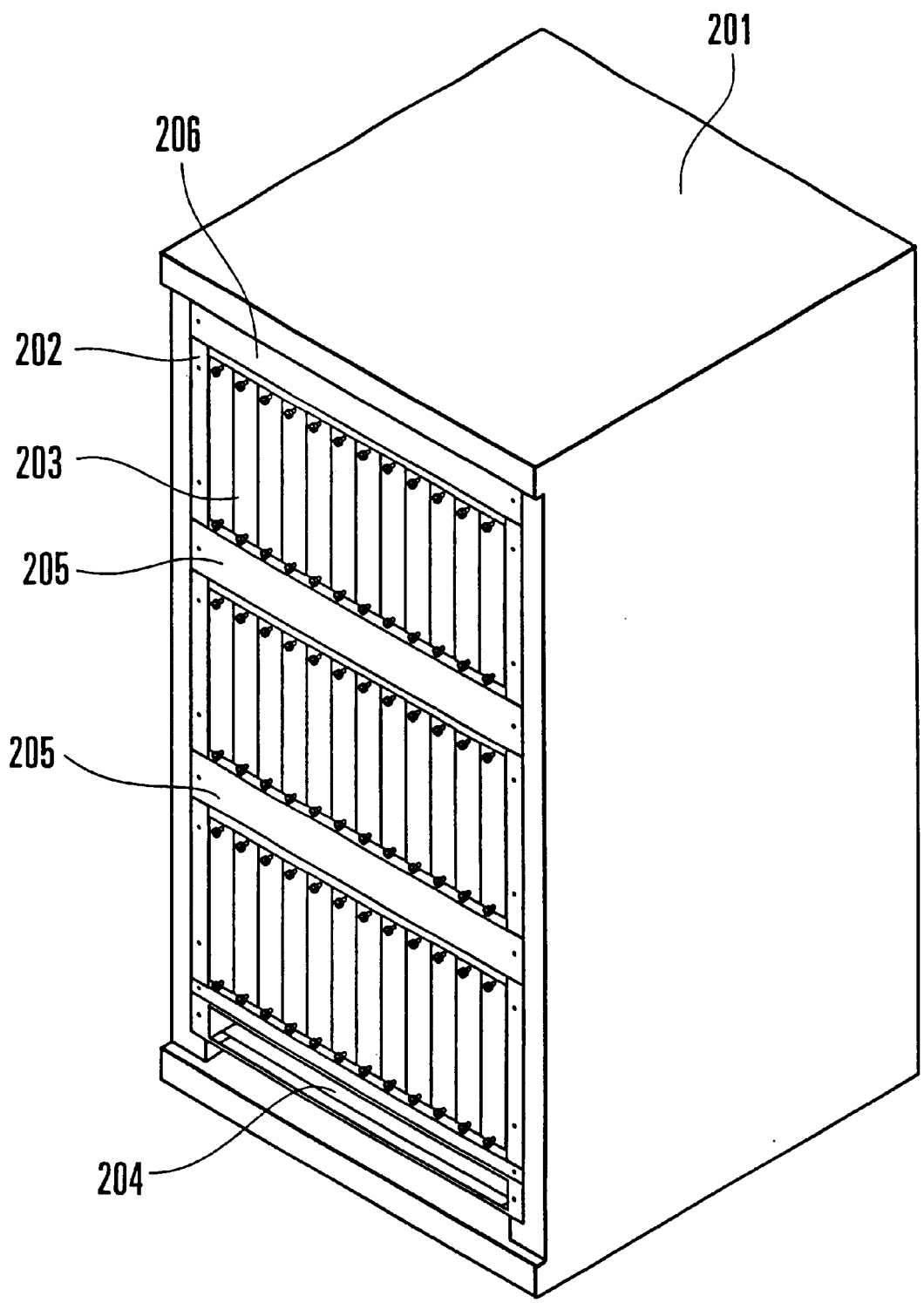
FIG. 7 is a perspective view showing the arrangement of a conventional plug-in unit storage rack-type apparatus.
Figure 8A:
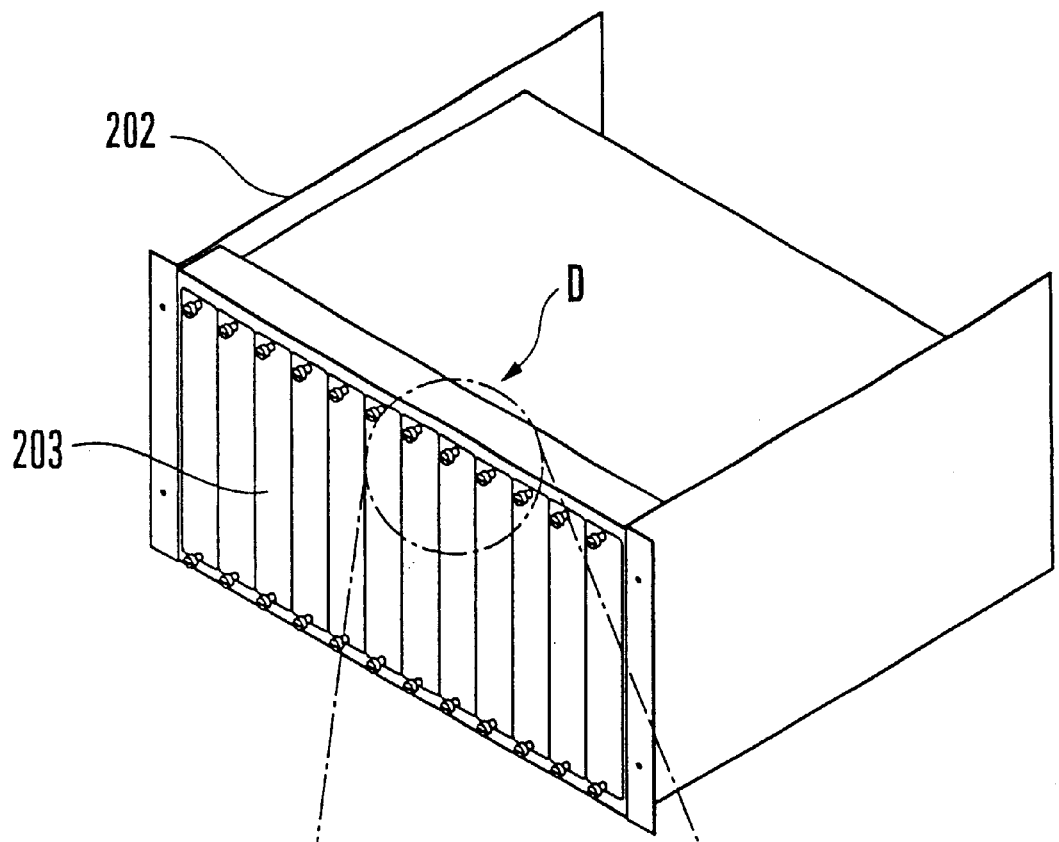
FIG. 8A is a perspective view of a subrack storing conventional plug-in units.
Figure 8B:
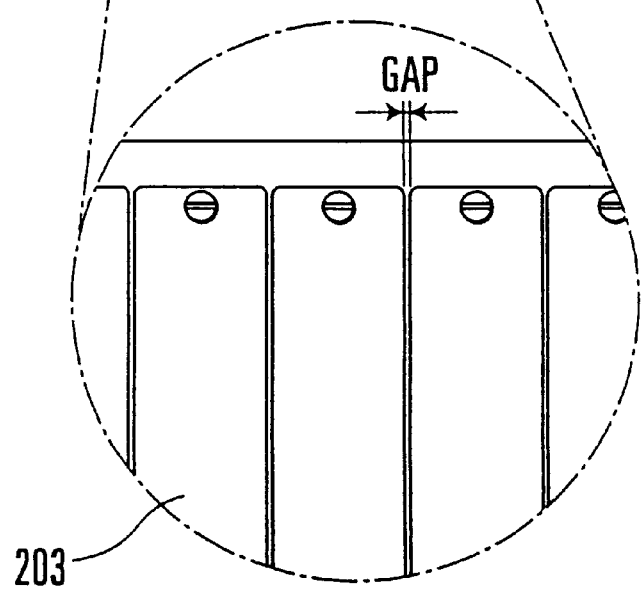
FIG. 8B is an enlarged view of a portion D shown in FIG. 8A.
Figure 9:
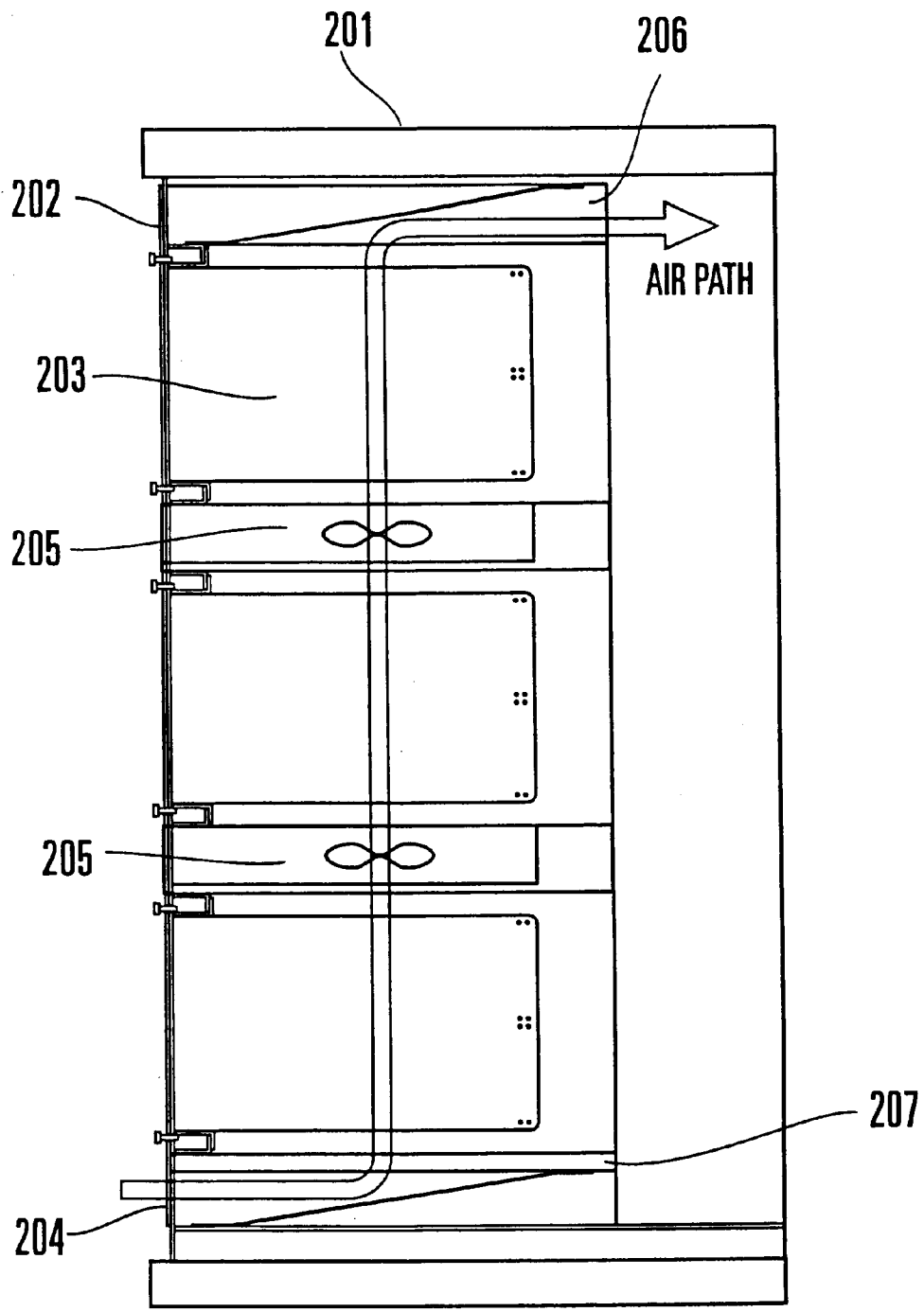
FIG. 9 is a view showing the heat dissipation structure and dustproof structure of the conventional plug-in unit storage rack-type apparatus.
Figure 10:
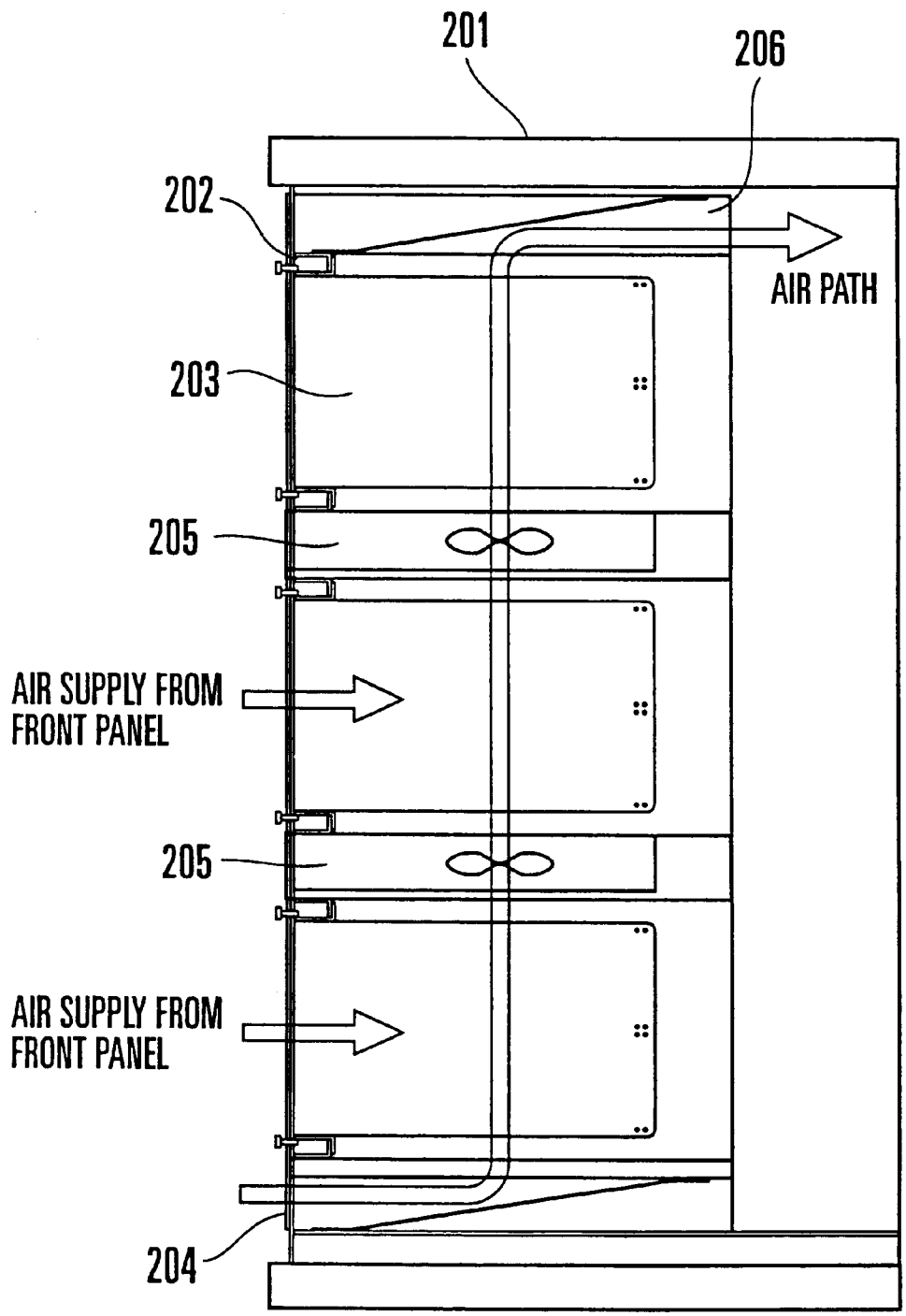
FIG. 10 is a view showing actual air supply and exhaust in the conventional plug-in unit storage rack-type apparatus.

As shown in FIG. 5B, when the plug-in units 103 are stored in the subrack 102, the microbristles 110 of each dustproof sheet 108 come into contact with the adjacent unit and are pressed against the adjacent unit to close the clearance between the front panels 107. In addition, as shown in FIG. 6B, the upper and lower portions of each plug-in unit 103 are fixed to the subrack 102 by screws. For this reason, the front panel 107 overlaps the subrack 102, and no gap is formed therebetween. Hence, the arrangement of the present invention can also prevent dust from entering from the front surface. The microbristles 110 are elastic and therefore do not impede insertion/removal of the units.

In the present invention, the materials of the plug-in unit 103 and dustproof sheet 108 are not particularly designated. However, the front panel 107 is preferably made of a metal material, and the dustproof sheet 108 is preferably formed from a conductive material. When these materials are used, an effect for shielding an electromagnetic wave from the front surface of the unit can be simultaneously obtained.

This embodiment is merely an example of the present invention. The present invention is not limited to the above embodiment. For example, if the plug-in unit 103 has a gap around it, the dustproof sheet 108 having the microbristles 110 need only be provided around the plug-in unit 103.

As has been described above, in the present invention, each plug-in unit has, on one side surface or around the unit, a number of microbristles which close the clearance between adjacent units when the unit is stored in the subrack. Generally, a clearance is ensured between adjacent plug-in units to prevent interference between the adjacent units. For this reason, dust may enter from this clearance due to the suction force of the fan and short-circuit a circuit formed on a board. However, the arrangement of the present invention can close the clearance formed between the plug-in units and consequently prevent dust from entering from the front surface.

Additionally, in the present invention, when the front panel is formed from a metal material, and the microbristles are formed from a conductive material, the effect for shielding an electromagnetic wave from the front surface of the unit can be simultaneously obtained.

What is claimed is:

1. A plug-in unit storage rack-type apparatus comprising:

a plurality of plug-in units;

a subrack for storing, from a front side, said plurality of plug-in units at a pitch including a clearance for preventing interference to an adjacent unit, a rack housing said subrack and containing a fan for drawing air through said clearance, conductive means attached to said plug-in units, for spanning the clearance to an adjacent plug-in unit when stored in said subrack; for filtering air passing through said clearance; and for simultaneously providing shielding of electromagnetic waves.

2. An apparatus according to claim 1, wherein said conductive means comprises microbristles provided on one side surface of said plug-in unit or around said plug-in unit.

3. An apparatus according to claim 1, wherein said conductive means comprises microbristles provided on a sheet bonded to said one side surface of said plug-in unit or around said plug-in unit.

4. An apparatus according to claim 1, wherein said conductive means comprises microbristles formed to a length not less than the clearance in a direction perpendicular to an insertion direction of said plug-in unit.

5. An apparatus according to claim 1, wherein said conductive means comprises microbristles elastic.

6. An apparatus according to claim 1, wherein a front panel of said plug-in unit is formed from a metal material.

* * * * *